United States Patent [19]
Kato et al.

[11] Patent Number: 5,642,083
[45] Date of Patent: Jun. 24, 1997

[54] HIGH-FREQUENCY SWITCH

[75] Inventors: Mitsuhide Kato, Shiga-ken; Teruhisa Tsuru, Kameoka, both of Japan

[73] Assignee: Murata Manufacturing Co., Ltd., Japan

[21] Appl. No.: 563,590

[22] Filed: Nov. 28, 1995

[30] Foreign Application Priority Data

Nov. 28, 1994 [JP] Japan .................................. 6-293166

[51] Int. Cl.$^6$ ..................................................... H01H 1/10
[52] U.S. Cl. ............................................. 333/103; 333/104
[58] Field of Search ................................. 333/103, 104;
307/112, 125, 129, 147; 379/242, 250,
291, 433, 434, 422, 306, 292

[56] References Cited

U.S. PATENT DOCUMENTS 3,374,364  3/1968  Concelman .................. 307/257
5,499,000  3/1996  Morikawa et al. .................. 333/104

Primary Examiner—William M. Shoop, Jr.
Assistant Examiner—Kim Lockett
Attorney, Agent, or Firm—Ostrolenk, Faber, Gerb & Soffen, LLP

[57] ABSTRACT

A high-frequency switch having first, second, third and fourth ports, and capable of connecting either of the first and second ports to either of the third and fourth ports. The switch has first, second, third and fourth diodes connected between the first and third ports, the first and fourth ports, the second and third ports, and the second and fourth ports, respectively. A first distributed parameter line and first capacitor, connected together in series, are connected from one end of each diode to a reference potential (ground). A resistor has one end connected to a connection point between each first distributed parameter line and the corresponding first capacitor, and a control voltage terminal connected to the other end of the resistor. A second distributed parameter line is connected from each of the first and second ports to the reference potential.

9 Claims, 3 Drawing Sheets

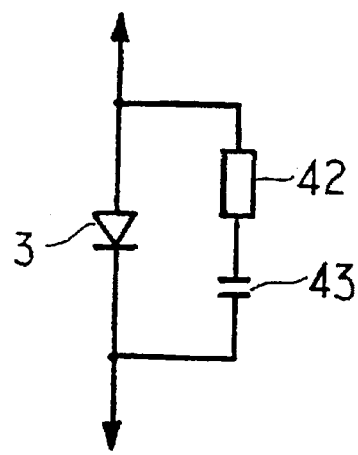
FIG. 3
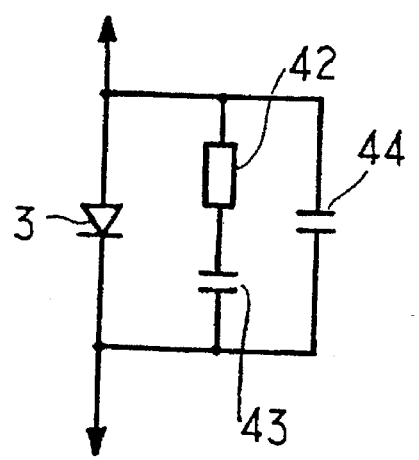
FIG. 4
FIG. 5
PRIOR ART
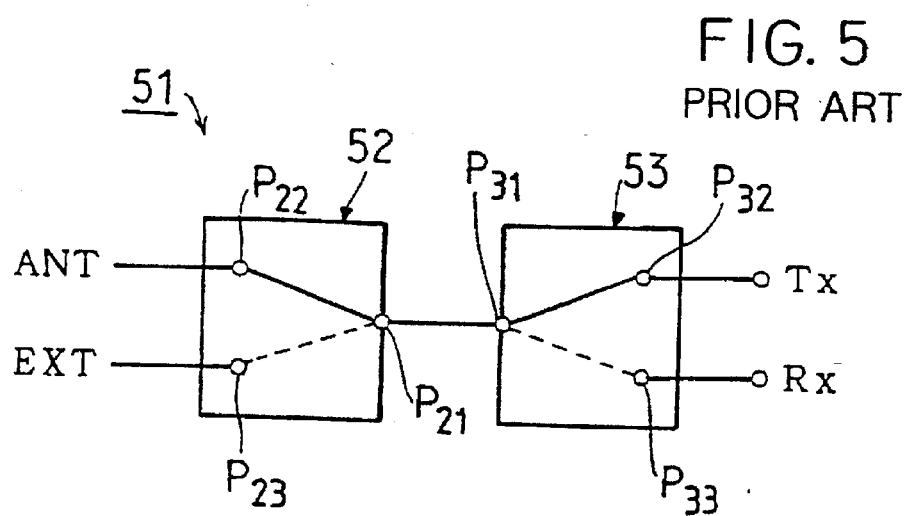

5,642,083

HIGH-FREQUENCY SWITCH

BACKGROUND OF THE INVENTION

1. Field of the Invention

The present invention relates to a high-frequency switch for changing over between signal paths in high-frequency circuits such as, for example, portable telephones, and in particular relates to high-frequency switches having four ports and employing diodes.

2. Description of Related Art

With portable telephones, two antennas or one antenna and one external terminal are sometimes shared between a transmitter and a receiver. The kind of switch circuit shown, for example, in FIG. 5, has conventionally been used in such structures.

A switch circuit 51 has a structure including two three-port switches 52 and 53 connected to each other. The switch 52 has a first port P21, a second port P22 and a third port P23 and the switch 53 similarly has first to third ports P31, P32 and P33. An antenna ANT is connected at the second port P22 of the switch 52 and the third port P23 is used as the external connection terminal EXT, with a second antenna being connected at this third port P23. That is, this switch circuit 53 may be used with vehicle-mounted portable telephones for connecting an antenna installed in the vehicle as a second antenna. Further, in order to measure electric characteristics of a receiver implemented in a portable telephone having such a switching circuit, the third port P23 may be used as an external terminal and a predetermined test signal may be applied to the port.

The structure of the switch 52 is such that the first port P21 may be switched over between the second port P22 and the third port P23. The first port P21 is connected to the first port P31 of the switch 53.

The first port P31 of the switch 53 is constructed so as to be capable of being changed over between the second port P32 and the third port P33. The second port P32 is connected to the transmitter Tx and the third port P33 is connected to the receiver Rx.

It is then possible to connect either the antenna ANT or the external terminal EXT to either the transmitter Tx or the receiver Rx.

A high-frequency switch using diodes shown in FIG. 6 is well known as a component for constructing the three-port-type switches 52 and 53. The high-frequency switch 61 has first to third ports P61 to P63 corresponding to the first to third ports P21 to P23 and P31 to P33. The port P61 is connected to the cathode of a diode 65a via a capacitor 64 and the anode of the diode 65a is connected to a second port P62 via a capacitor 66a. Further, one end of a distributed parameter line 67a is electrically connected at a connection point A between the anode of the diode 65a and the capacitor 66a. This distributed parameter line 67a is of a strip line structure of length λ/4 or less where λ is taken to be the wavelength of a high-frequency signal flowing through the switch 61. The other end of the distributed parameter line 67a is connected to a ground potential via a capacitor 68a. Further, one end of a resistor 69a is connected to a connection point between the distributed parameter line 67a and the capacitor 68a and the other end of the resistor 69a is connected to a control voltage terminal VC1.

Further, the first port P61 is connected to a distributed parameter line 71 constructed in the same way as the distributed parameter line 67a via the capacitor 64, with the other end of the distributed parameter line 71 being connected to a ground.

Moreover, the cathode of a diode 65b is connected to the first port P61 via the capacitor 64 and the anode of the diode 65b is connected to the third port P63 via a capacitor 66b. A series circuit comprising a distributed parameter line 67b and a capacitor 68b is also connected across the anode of the diode 65b and ground in the same way as on the side of the diode 65a. Also, one end of a resistor 69b is connected to a connection point between the distributed parameter line 67b and the capacitor 68b and the other end is connected to a control voltage terminal VC2.

With the high-frequency switch 61, the port P61 can be connected to either the second port P62 or the third port P63 by applying different control voltages to the first control voltage terminal VC1 and the second control voltage terminal VC2. For example, if a positive control voltage is applied at the control voltage terminal VC1, while on the other hand, a negative control voltage is applied at the control voltage terminal VC2, a forward bias is applied to the diode 65a and a reverse bias voltage is applied to the diode 65b. A control current supplied from the control voltage terminal VC1 is blocked by the capacitors 66a, 68a, 64, 66b and 68b which restrict the flow of direct current. A current therefore flows in the circuit portion including the distributed parameter line 67a, the diode 65a and the distributed parameter line 71, and the diode 65a is turned on. On the other hand, on the side of the diode 65b, the diode 65b is turned off because a reverse bias voltage is applied to the diode 65b.

Further, with regard to a high-frequency signal provided from the second port P62, the capacitance 68a can be large because the distributed parameter line 67a is provided as described above. The impedance of the series circuit including the distributed parameter line 67a therefore becomes infinite at the connection point A, and therefore a high-frequency signal applied to the second port P62 proceeds to the first port P61.

On the other hand, when a negative control voltage is applied to the first control voltage terminal VC1 and a positive control voltage is applied to the second control voltage terminal VC2, a reverse bias voltage is applied to the diode 65a and a forward bias voltage is applied to the diode 65b. The diode 65a therefore goes off and the diode 65b goes on. There is therefore no signal flow between the second port P62 and the first port P61 and no signal flow between the first port P61 and the third port P63. There is also no high-frequency signal flow through the distributed parameter line 67b because the impedance of the series circuit comprised of the distributed parameter line 67b and the capacitor 68b is infinite at the connection point B.

The distributed parameter lines 67a and 67b form current paths for the control current to flow through the diodes 65a and 65b. Therefore, with respect to high frequencies, the impedance of the distributed parameter lines 67a and 67b at the connection points A and B can be made high and the insertion loss and reflection loss can be reduced.

In this way, the first port P61 can be switched over between the second port P62 and the third port P63 in the high-frequency switch 61 by applying positive and negative control voltages to the control voltage terminals VC1 and VC2.

The switch circuit 51 shown in FIG. 5 is constructed in such a manner that one high-frequency switch 61 is used as each of the switches 52 and 53, that is, two three-port high-frequency switches are used with their first ports being connected in common.

Because the switch circuit 51 is constructed from two connected switches 52 and 53, high-frequency signals pass through the two switches. For example, a transmission output from the transmitter Tx passes through the two switches 53 and 52 before being provided to the antenna ANT. Similarly, a high-frequency signal inputted from the antenna ANT passes through both the switches 52 and 53 before being provided to the receiver Rx. The insertion loss therefore becomes large. Because of the large insertion loss, the transmission output at the time of transmission has to be increased, and the gain is reduced during receiving. It is therefore strongly recommended for the insertion loss to be reduced.

Moreover, control voltages have to be applied to the first and second control terminals of each of the switches 52 and 53 in the switch circuit 51 because the switches 52 and 53 are constructed using high-frequency switches 61, so that two power supplies for supplying control voltages are necessary for each of the switches 52 and 53. This makes it necessary to form a complicated power supply circuit pattern on a substrate.

It is therefore an object of the present invention to provide a high-frequency switch having four ports that is capable of connecting either of the two ports on one side or the other to either of the remaining two ports, that causes a small insertion loss, and that has a reduced number of constituent parts.

SUMMARY OF THE INVENTION

A high-frequency switch having first, second, third and fourth ports, capable of switching between the first and second ports, and the third and fourth ports, comprises first, second, third and fourth diodes, a first distributed parameter line and first capacitor, a resistor, a control voltage terminal and a second distributed parameter line. The first, second, third and fourth diodes are connected across the first and third ports, the first and fourth ports, the second and third ports, and the second and fourth ports, respectively, each diode being in a predetermined direction with respect to the first and second ports. All of the cathodes may be directed toward the first and second ports, or all of the anodes, or other arrangements are also usable.

The first distributed parameter line and first capacitor are connected together in series between one side of each diode, such as the side toward the third or fourth port, and a reference potential (or ground). The resistor has one end connected to a connection point between each first distributed parameter line and the corresponding first capacitor. The control voltage terminal is connected to the remaining end of the resistor. A second distributed parameter line is connected between each of the first and second ports and the reference potential.

In the high-frequency switch of the present invention, a third distributed parameter line and a second capacitor connected in series may be connected in parallel with at least one of the first, second, third and fourth diodes.

According to a further aspect of the present invention, an additional capacitor may be connected between the ends of at least one of the diodes.

Moreover, according to another aspect of the present invention, a second resistor may be connected in parallel with at least one of the diodes.

According to yet another aspect of the invention, a compensating capacitor can be connected between ground and one end of each diode, or one of the third and fourth ports, or both.

In the high-frequency switch of the present invention, the switch may be operated by just one of the diodes being "on".

That is, just the first diode needs to be on when a high-frequency signal is to flow across the first and third ports, while in the same way, just the second diode needs to be on for a high-frequency signal to flow across the first port and the fourth port. Further, just the third diode needs to be on when it is necessary for a high-frequency signal to flow across the second port and the third port and just the fourth diode needs to be on when a high-frequency signal is to flow across the second port and the fourth port. In other words, just one diode is on during operation.

Because changeover can be carried out using a single high-frequency switch having four diodes, the insertion loss may be halved, in comparison with the case where two switches are used.

In the present invention, the switch circuit is constructed in such a manner that the four diodes are connected in a loop shape between the four ports and are preferably arranged so as to face in the same direction with respect to the first port and the second port. (Other arrangements are also possible.) In this way, it is possible to connect either the first port or the second port to either the third port or the fourth port, while reducing the number of switches and the number of diodes that are on during operation.

The object of the second capacitor is to block d.c. but this second capacitor also influences the resonant frequency slightly.

Further, in the structure where a third distributed parameter line and a second capacitor connected in series are connected in parallel with at least one of the four diodes, a parallel resonance circuit is constructed from the discharge capacitance of the diode in the off state and the impedance of the third distributed parameter line and the second capacitor. By then adopting a structure such that the resonant frequency of this parallel resonance circuit coincides with the frequency of the high-frequency signal flowing through the switch, the impedance of the diode when off can be made high, as can the isolation characteristics. In this case, the second capacitor serves to prevent the d.c. biasing of the circuit portion including the third distributed parameter line connected in parallel with the diode.

Moreover, when a third capacitor is connected between the two ends of at least one of the four diodes and the third capacitor, the characteristic impedance can be adjusted using this third capacitor, and the insertion loss and reflection loss can be reduced. Further, the length of the first distributed parameter line may be shortened and the high-frequency switch may be made smaller.

In the structure where a second resistor is connected in parallel with at least one of the four diodes, a charge accumulated in the discharge capacitor when the diode is off is discharged by the second resistor when the diode goes on. This means that the switching operation wherein the diode goes from being off to being on is smooth.

Other features and advantages of the present invention will become apparent from the following description of the invention which refers to the accompanying drawings.

BRIEF DESCRIPTION OF THE DRAWINGS

FIG. 3 is a circuit diagram illustrating a further example of a modification to the high-frequency switch of the embodiment;

FIG. 4 is a circuit diagram illustrating a still further example of a modification to the high-frequency switch of the embodiment;

FIG. 5 is a diagrammatic structural view illustrating a conventional high-frequency switch.

DETAILED DESCRIPTION OF EMBODIMENTS OF THE INVENTION

The present invention will become clear from the following description of the embodiment with reference to the drawings.

Figure 1:
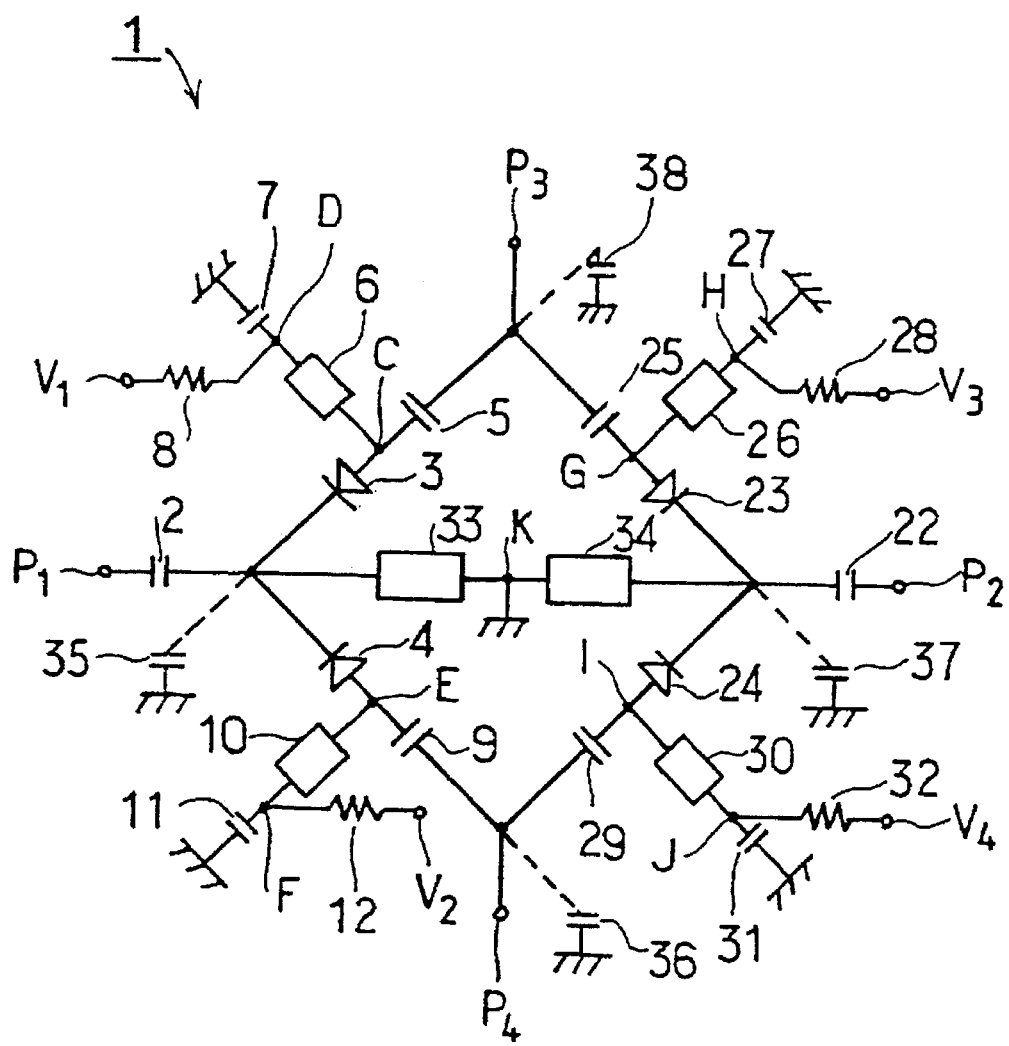
FIG. 1 is a circuit diagram of a high-frequency switch according to one embodiment of the present invention.

FIG. 1 is a circuit diagram of a high-frequency switch according to an embodiment of the present invention.

A high-frequency switch 1 has first to fourth ports P1 to P4 with the construction being such that a connection may be made across any of the following: the first port P1 and the third port P3, the first port P1 and the fourth port P4, the second port P2 and the third port P3, and the second port P2 and the fourth port P4. In other words, the first port P1 or the second port P2 may be connected to either of the remaining two ports P3 and P4.

This kind of high-frequency switch 1 may be used, for example, as a conventional switch circuit 51 shown in FIG. 5, with a connection being made by the switch circuit 51 between the antenna ANT and the transmitter Tx or the receiver Rx during actual use. Alternatively, an external terminal EXT may be connected to the transmitter Tx or the receiver Rx.

This is to say that either a connection across the antenna ANT and the transmitter Tx (during transmission), a connection across the antenna ANT and the receiver Rx (during receiving), a connection across the external terminal EXT and the transmitter Tx (in the case of transmissions utilizing an external antenna or when measuring the transmission characteristics) or a connection across the external terminal EXT and the receiver Rx (when utilizing an external receiving antenna, or when measuring the receiving characteristics of the receiver, etc.) is adopted at the time of use. In this way, the high-frequency switch 1 functions in the same way as the switch circuit 51, with the first port P1 and the second port P2 of the high-frequency switch 1 of this embodiment being connected to the antenna ANT and the external terminal EXT, and the third port P3 and the fourth port P4 being connected to the transmitter Tx or the receiver Rx, for example.

The details and operation of the high-frequency switch 1 are described below.

In the high-frequency switch 1, the cathodes of first and second diodes 3 and 4 are connected to the first port P1 via a capacitor 2. The anode of the first diode 3 is connected to the third port 3 via a capacitor 5. Further, a distributed parameter line 6 and a capacitor 7 are connected across a connection point C between the anode of the first diode 3 and the capacitor 5 and an earth potential. This distributed parameter line 6 is constructed from a strip line and constitutes a 90° phase-shifter or an impedance line having a wavelength of ¼ or less of the wavelength of the high-frequency signal flowing through the high-frequency switch 1. Further, one end of a resistor 8 is connected at a connection point D between the distributed parameter line 6 and the capacitor 7, with the remaining end of the resistor 8 being connected to a first control voltage terminal V1.

Similarly, the anode of the second diode 4 and the fourth port P4 are connected via a capacitor 9 across the first port P1 and the fourth port P4. Further, a distributed parameter line 10 constructed in the same way as the distributed parameter line 6, and a capacitor 11 are connected across a connection point E between the anode of the diode 4 and the capacitor 9 and a reference potential. One end of a resistor 12 is then connected to a connection point F between the distributed parameter line 10 and the capacitor 11, with the remaining end of the resistor 12 being connected to a second control voltage terminal V2.

On the other hand, the cathodes of third and fourth diodes 23 and 24 are connected to the second port P2 via a capacitor 22. The circuit structure between this second port P2 and the third port P3, and the circuit structure between the second port P2 and the fourth port P4 is the same as between the first port P1 and the third port P3, and the first port P1 and the fourth port P4. Corresponding portions are therefore given corresponding reference numerals and their detailed description is omitted.

Namely, a capacitor 25 and a distributed parameter line 26 are connected to the anode of the third diode 23. Further, the distributed parameter line 26 and a capacitor 27 are connected in series across a connection point G between the anode of the diode 23 and the capacitor 25 and a reference potential. A connection point H between the distributed parameter line 26 and the capacitor 27 is then connected to a third control voltage terminal V3 via a resistor 28.

In the same way, the anode of the fourth diode 24 is connected to the fourth port P4 via the capacitor 29. A connection point I between the anode of the fourth diode 24 and the capacitor 29 is then connected to an earth potential via a distributed parameter line 30 and a capacitor 31. On the other hand, a connection point J between the distributed parameter line 30 and the capacitor 31 is connected to the fourth control voltage terminal V4 via the resistor 32.

Also provided are distributed parameter lines 33 and 34, which are connected to the first port P1 and the second port P2 via the capacitors 2 and 22. The distributed parameter lines 33 and 34 are constructed in the same way as the distributed parameter line 6, with a connection point K in-between the distributed parameter lines 33 and 34 being connected to an earth potential.

Next, the operation of the high-frequency switch 1 will be described. First, the case where a high-frequency signal is flowing between the first port P1 and the third port P3 is described. In this case, a positive control voltage is applied to the first control voltage terminal V1, as shown in Table 1. A negative control voltage is then applied to the second to fourth control voltage terminals V2 to V4. As a result, a control current flows through a circuit portion including the resistor 8, the distributed parameter line 6, and the diode 3, a forward-biased voltage is applied to the third diode 3, and the first diode 3 goes "on", with a high-frequency signal therefore flowing between the first port P1 and the third port P3. In this case, when viewed from the connection point C to the side of the distributed parameter line 6, no current flows from the connection point C to the distributed parameter line 6 because the impedance of the series circuit constructed from the distributed parameter line 6 and the capacitor 7 becomes infinite.

On the other hand, a reverse bias voltage is applied to the second diode 4 by applying a negative control voltage to the second control voltage terminal V2. The second diode 4 therefore goes off and no signal flows between the first port P1 and the fourth port P4. Reverse bias voltages are also applied to the third diode 23 and the fourth diode 24, so that these diodes also go off. Therefore, no signal flows between the second port P2 and the third port P3, and between the second port P2 and the fourth port P4.

Also, no high-frequency signal flows between the first port P1 and the second port P2. This is because the distributed parameter line 33 is connected across the first port P1 and earth potential via the capacitor 2.

In this way, by applying a positive control voltage to the first control voltage terminal V1 and negative control voltages to the remaining second to fourth control voltage terminals V2 to V4, a first connection is possible, i.e. a signal may flow between the first port P1 and the third port P3.

As is also shown by Table 1, a high-frequency signal may flow across the first port P1 and the fourth port P4 by applying a positive control voltage to the second control voltage terminal V2 so that the second diode 4 goes on, while applying negative control voltages to the first, third and fourth control voltage terminals V1, V3 and V4 so that the remaining first, third and fourth diodes 3, 23 and 24 go off.

Further, as is also shown in Table 1, a high-frequency signal may flow between the second port P2 and the third port P3 by applying a positive control voltage to the third control voltage terminal V3 and applying a negative control voltage to the remaining control voltage terminals V1, V2 and V4. Moreover, a high-frequency signal may flow between the second port P2 and the fourth port P4 by applying a positive control voltage to the fourth control voltage terminal V4 and negative control voltages to the remaining control voltage terminals V1, V2 and V3.

TABLE 1

| Connection | $V_1$ | $V_2$ | $V_3$ | $V_4$ |
|---|---|---|---|---|
| $P_1$–$P_3$ | $+V_{cc}$ | $-V_{cc}$ | $-V_{cc}$ | $-V_{cc}$ |
| $P_1$–$P_4$ | $-V_{cc}$ | $+V_{cc}$ | $-V_{cc}$ | $-V_{cc}$ |
| $P_2$–$P_3$ | $-V_{cc}$ | $-V_{cc}$ | $+V_{cc}$ | $-V_{cc}$ |
| $P_2$–$P_4$ | $-V_{cc}$ | $-V_{cc}$ | $-V_{cc}$ | $+V_{cc}$ |

This is to say that in the high-frequency switch 1 of this embodiment, a switch circuit capable of achieving each of the aforementioned connections has been constructed in the above way using the four diodes 3, 4, 23 and 24. It is therefore possible to halve the insertion loss, in comparison with the conventional switch circuit 51 employing switches 52 and 53, because a single-switch circuit structure is employed.

In addition, with the high-frequency switch 1, only one diode goes on for each of the connections so that only one bias circuit is ever operating. As a result, the lifetime of the diodes and bias circuits is lengthened and the period of use of communications equipment such as portable telephones etc. into which the high-frequency switch 1 is built is extended.

Further, capacitors 35 and 37 may be connected from the cathodes of the first to fourth diodes 3, 4, 23 and 24 to earth potential, and capacitors 36 and 38 may be connected from the third and fourth ports P3 and P4 to earth potential, as shown by the dashed lines in FIG. 1. In this case, the characteristic impedance may be compensated for by selecting the electrostatic capacitance of the capacitors 35 to 38 so that the insertion loss and reflection loss of the high-frequency switch 1 may be effectively reduced. In addition, the length of the distributed parameter lines 6, 10, 26 and 30 may be shortened and the high-frequency switch 1 may be made more compact as a result.

In FIG. 1 capacitors 35 to 38 are shown as being connected between the ends of respective diodes and ground.

Alternatively, the capacitors may be connected between each diode and ground by being connected between both ends of any one diode.

The switch 1 in FIG. 1 may also be constructed by connecting all of the diodes 3, 4, 23 and 24 in the opposite direction to that shown in FIG. 1. In this case, each of the connections can be achieved in the same way by applying control voltages as shown in the second table.

TABLE 2

| Connection | $V_1$ | $V_2$ | $V_3$ | $V_4$ |
|---|---|---|---|---|
| $P_1$–$P_3$ | $-V_{cc}$ | $+V_{cc}$ | $+V_{cc}$ | $+V_{cc}$ |
| $P_1$–$P_4$ | $+V_{cc}$ | $-V_{cc}$ | $+V_{cc}$ | $+V_{cc}$ |
| $P_2$–$P_3$ | $+V_{cc}$ | $+V_{cc}$ | $-V_{cc}$ | $+V_{cc}$ |
| $P_2$–$P_4$ | $+V_{cc}$ | $+V_{cc}$ | $+V_{cc}$ | $-V_{cc}$ |

Further, all of the connections can also be achieved in the same way as in the aforementioned embodiment by connecting just the first and second diodes 3 and 4 or just the third and fourth diodes 23 and 24 in the opposite direction to that shown in FIG. 1 and applying suitable control voltages in view of the direction of the diodes.

Figure 2:
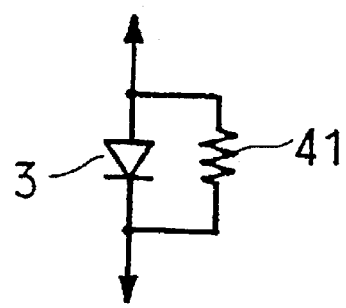
FIG. 2 is a circuit diagram illustrating an example of a modification of the high-frequency switch of this embodiment.
Figure 6:
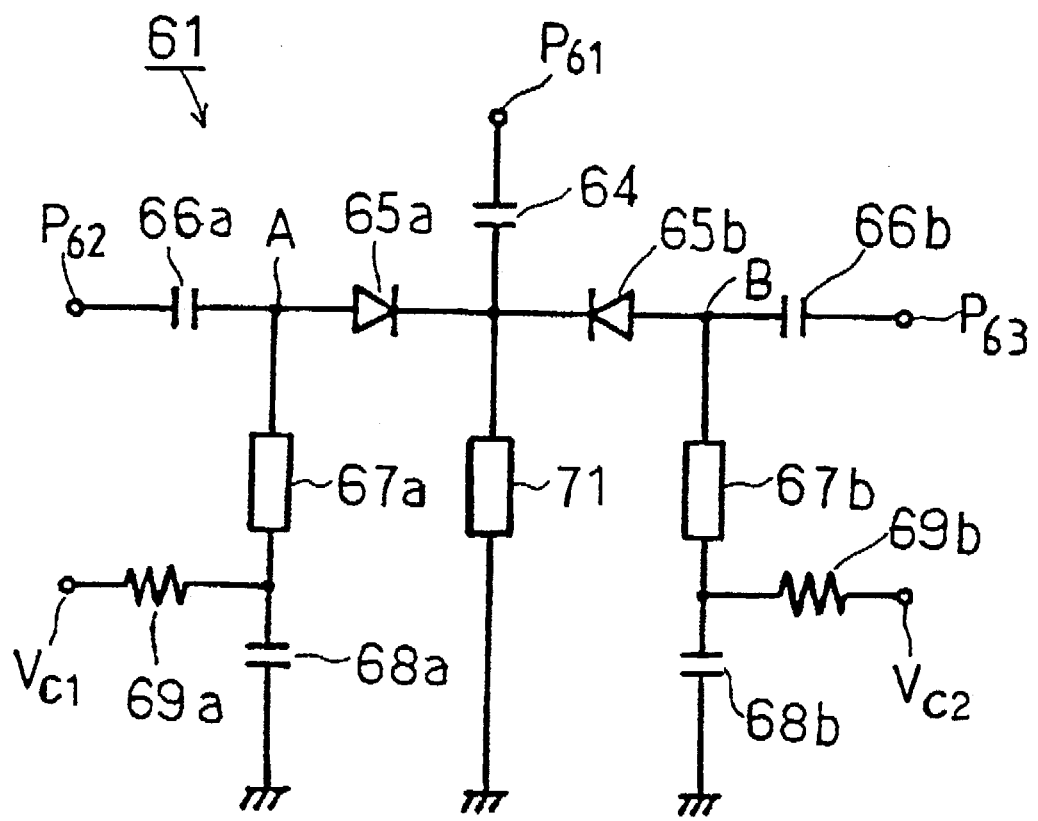
FIG. 6 is a circuit diagram showing an example of a conventional three-port-type high-frequency switch.

Next, examples of modifications of the high-frequency switch of the aforementioned embodiment will be described with reference to FIGS. 2 to 4, showing circuit devices that are to be connected in place of the first to fourth diodes 3, 4, 23 and 24 as described hereafter. The descriptions given in FIG. 2 to FIG. 4 will use only the first diode 3 as an example.

As shown in FIG. 2, a discharge resistor 41 is connected in parallel with the first diode 3 and will be referred to as the second resistor. When off, the diode 3 functions as a capacitor in response to direct current. Therefore, a charge accumulated during the off state will begin to flow at the same time as the diode 3 goes on. However, in the structure shown in FIG. 2, the accumulated charge is discharged by the discharge resistor 41 and the operation of switching the diode 3 from off to on goes more smoothly.

In the modification shown in FIG. 3, a distributed parameter line 42 and a capacitor 43 connected in series are connected in parallel with the diode 3. A parallel resonance circuit is therefore formed, comprising the discharge capacitance occurring when the diode 3 is off, the inductance portion of the distributed parameter line 42, and the capacitor 43. The impedance of the diode 3 when off can therefore be made high by adjusting the inductance portion of the distributed parameter line 42 so that the resonance frequency of the parallel resonance circuit coincides with the frequency of the transmitted high-frequency signal. This means that the isolation between the third port P3 and the first port P1 when the first port P1 is off can be made higher. The capacitor 43 is provided so as to prevent direct current passing through the distributed parameter line 42.

The distributed parameter line 42 may be of a strip line, micro-strip line, or coplanar line structure etc. but the length and impedance are to be selected so that the resonant frequency of the parallel resonance circuit coincides with the frequency of the high-frequency signal.

In the example modification shown in FIG. 4, the distributed parameter line 42 for constructing the parallel resonance circuit is connected in parallel with the first diode 3 in the same way as in FIG. 3, with the capacitor 43 being connected in series with the distributed parameter line 42. In addition, an additional capacitor 44 is connected in parallel with both the diode 3 and the circuit portion comprising the distributed parameter line 42 and the capacitor 43. The additional capacitor 44 is attached to the structure shown in FIG. 3 in response to the case where the discharge capacity of the off state of the diode 3 is small. In this way, a parallel resonance circuit is constructed from the composite discharge capacitance of the off-state discharge capacitance of the diode 3, the discharge capacitance of the capacitor 44, and the inductance portion of the distributed parameter line 42. The resonant frequency of the parallel resonance circuit can therefore easily be made to correspond with the frequency of the high-frequency signal.

The present invention therefore provides a four-port high-frequency switch having first to fourth ports constructed using four diodes. Only one of the high-frequency switches of the present invention is therefore able to switch between the first and second ports and the third and fourth ports. The number of high-frequency switches used therefore becomes half the number used in the related art in applications such as, for example, portable telephones where two antennas, or one antenna and an external terminal, are switched over between a receiver and a transmitter. It is therefore also possible to reduce the insertion loss by 10 approximately half.

Further, the life time of the diodes during operation can be lengthened because only one diode goes on at a time and the period of use of the high-frequency switch and communications equipment into which the high-frequency switch is built-into may therefore be extended.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high-frequency switch having first, second, third and fourth ports, and capable of connecting either the first or second port to either the third or fourth port, respectively, comprising:

first, second, third and fourth diodes connected between the first and third ports, the first and fourth ports, the second and third ports, and the second and fourth ports, respectively, each of the first second, third and fourth diodes being connected in a respective predetermined direction with respect to the first and second ports, with a first end of each diode directed toward one of said first and second ports and a second end of each diode directed toward one of said third and fourth ports;

a respective series circuit of a first distributed parameter line and a first capacitor, connected between the second end of each diode and a reference potential;

a resistor having one end connected to a connection point between each first distributed parameter line and the corresponding first capacitor;

a control voltage terminal connected to the remaining end of the resistor; and a respective second distributed parameter line connected between each of the first and second ports and the reference potential.

2. A high-frequency switch according to claim 1, wherein an additional capacitor is connected between the first and second ends of at least one of the first, second, third and fourth diodes.

3. A high-frequency switch according to claim 1, wherein a second resistor is connected in parallel with at least one of the first, second, third and fourth diodes.

4. A high-frequency switch according to claim 1, wherein a respective series circuit of a third distributed parameter line and a second capacitor is connected in parallel with at least one of the first, second, third and fourth diodes.

5. A high-frequency switch according to claim 4, wherein an additional capacitor is connected between the first and second ends of at least one of the first, second, third and fourth diodes.

6. A high-frequency switch according to claim 1, wherein the first end of each diode is the cathode end of the diode.

7. A high-frequency switch according to claim 1, further comprising a respective compensating capacitor connected between the first end of each diode and ground.

8. A high-frequency switch according to claim 7, further comprising a respective port capacitor connected between each of the third and fourth ports and ground.

9. A high-frequency switch according to claim 1, further comprising a respective port capacitor connected between each of the third and fourth ports and ground.

* * * * *